(12) United States Patent
Xia et al.

(10) Patent No.: US 7,343,962 B2
(45) Date of Patent: Mar. 18, 2008

(54) HEAT SINK

(75) Inventors: Wan-Lin Xia, Shenzhen (CN); Tao Li, Shenzhen (CN); Min-Qi Xiao, Shenzhen (CN); Yong Zhong, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,862

(22) Filed: May 16, 2006

(65) Prior Publication Data

US 2007/0107871 A1   May 17, 2007

(30) Foreign Application Priority Data

Nov. 17, 2005   (CN)   ......................... 2005 1 0101526

(51) Int. Cl.
*H05K 7/20* (2006.01)

(52) U.S. Cl. ..................... 165/80.3; 62/259.2; 361/697

(58) Field of Classification Search .............. 165/80.3, 165/146, 185; 62/259.2; 361/690, 697

See application file for complete search history.

(56) References Cited

U.S. PATENT DOCUMENTS

| | | | | |
|---|---|---|---|---|
| 5,959,837 A * | 9/1999 | Yu | ............................. | 361/697 |
| 5,991,154 A * | 11/1999 | Clemens et al. | ............ | 361/704 |
| 6,031,720 A | 2/2000 | Crane et al. | | |
| 6,062,301 A * | 5/2000 | Lu | ............................. | 165/80.3 |
| 6,076,594 A * | 6/2000 | Kuo | ........................... | 165/80.3 |
| 6,097,597 A * | 8/2000 | Kobayashi | ................... | 361/687 |
| 6,226,178 B1 * | 5/2001 | Broder et al. | ............... | 361/687 |
| 6,287,136 B1 * | 9/2001 | Deutsch | ..................... | 439/337 |
| 6,301,779 B1 * | 10/2001 | Azar | ....................... | 29/890.03 |
| 6,351,382 B1 * | 2/2002 | Nakanishi et al. | .......... | 361/700 |
| 6,625,021 B1 * | 9/2003 | Lofland et al. | ............. | 361/697 |
| 6,639,802 B1 * | 10/2003 | Dong et al. | ................. | 361/709 |
| 6,717,811 B2 | 4/2004 | Lo et al. | | |
| 6,909,608 B2 * | 6/2005 | Fan | ........................... | 361/700 |
| 6,935,419 B2 * | 8/2005 | Malone et al. | .............. | 165/185 |
| 6,937,474 B2 * | 8/2005 | Lee | ............................ | 361/715 |
| 6,958,915 B2 * | 10/2005 | Wang et al. | ................ | 361/709 |
| 6,959,755 B2 * | 11/2005 | Chen | ......................... | 165/80.3 |
| 6,977,814 B2 * | 12/2005 | Hornung | ..................... | 361/690 |
| 7,028,758 B2 * | 4/2006 | Sheng et al. | ........... | 165/104.21 |
| 7,044,197 B2 * | 5/2006 | Lee et al. | ................... | 165/80.3 |
| 7,073,568 B2 * | 7/2006 | Chen et al. | ............ | 165/104.33 |

(Continued)

FOREIGN PATENT DOCUMENTS

CN      2339963 Y      9/1999

(Continued)

*Primary Examiner*—William E. Tapolcai
(74) *Attorney, Agent, or Firm*—Jeffrey T. Knapp (57) ABSTRACT

A heat sink for dissipating heat from an electronic component comprises a heat spreader and a plurality of first fins and second fins provided thereon. The first and second fins are parallel to each other and arranged in alternating order so as to define a plurality of air passages. The first and second fins are so arranged that thinner air passages and denser fin distribution in the middle along the extension direction of the air passages and wider air passages and lower fin distribution density at two ends are provided.

15 Claims, 6 Drawing Sheets

U.S. PATENT DOCUMENTS

| | | | |
|---|---|---|---|
| 7,102,890 B2 * | 9/2006 | Lee et al. | 361/704 |
| 2004/0066628 A1 * | 4/2004 | Liu | 361/704 |
| 2005/0225946 A1 * | 10/2005 | Fan et al. | 361/710 |
| 2005/0257532 A1 * | 11/2005 | Ikeda et al. | 62/3.7 |
| 2005/0286232 A1 * | 12/2005 | Chen et al. | 361/710 |

FOREIGN PATENT DOCUMENTS

| | | |
|---|---|---|
| CN | 2720626 Y | 8/2005 |
| TW | 572582 | 1/2004 |

* cited by examiner

HEAT SINK

FIELD OF THE INVENTION

The present invention relates to a heat dissipation device for an electronic component, and particularly to a heat dissipation device having fins with different distances therebetween.

DESCRIPTION OF RELATED ART

Electronic components such as central processing units (CPUs) generate great amounts of heat during normal operation. Unless removed, such heat will adversely affect the operational stability of the CPUs. Measures must therefore be taken to efficiently remove the heat. Typically, a heat sink is mounted on a CPU to remove heat therefrom.

A conventional heat sink generally includes a flat base for contacting the electronic component to absorb heat therefrom, and a plurality of parallel fins formed on a top face of the base for dissipating the heat absorbed. A plurality of air passages is defined between the fins. To strengthen heat dissipation of the heat sink, a fan is commonly mounted thereon to provide airflow through the air passages between the fins.

A high performance heat sink is important to ensure normal operation of the electronic component, therefore many methods are developed to enhance the capability of the heat sink. Heat dissipation speed is directly proportional to surface area of a heat sink; methods to increase surface area and so increase heat dissipation of a heat sink include enlarging the fins or increasing the quantity of the fins. Since large fins lead to greater volume being occupied in a computer system, it is usually better to increase fin quantity.

However, as the heat sink and the fan operate jointly, a contradiction arises in increasing the quantity of the fins. An overly-dense fin configuration narrows the passages between the fins and increases entrance resistance of airflow provided by the fan. Thus as the number of fins increases, the volume of airflow excluded from the heat sink also increases and heat accumulated on the heat sink cannot be quickly carried away by heat exchange. However, a heat sink with only a small number of fins will only have a small heat dissipation surface area, interface area for heat exchange between heat sink and airflow is also small, and resulting capacity of the heat sink will be limited.

Accordingly, what is needed is a heat sink which has a satisfactory fin configuration for effectively removing heat from a heat-generating electronic component.

SUMMARY OF THE INVENTION

A heat sink for removing heat from a heat-generating electronic device in accordance with a preferred embodiment of the present invention comprises a plurality of parallel fins, stacked together and defining a plurality of parallel air passages. The fin density at two ends of the air passages is lower than that in the middle thereof.

Other advantages and novel features of the present invention will become more apparent from the following detailed description of preferred embodiment when taken in conjunction with the accompanying drawings, in which:

DETAILED DESCRIPTION OF THE INVENTION

Reference will now be made to the drawing figures to describe a heat sink in accordance with a preferred embodiment of the present invention.

Figure 1:
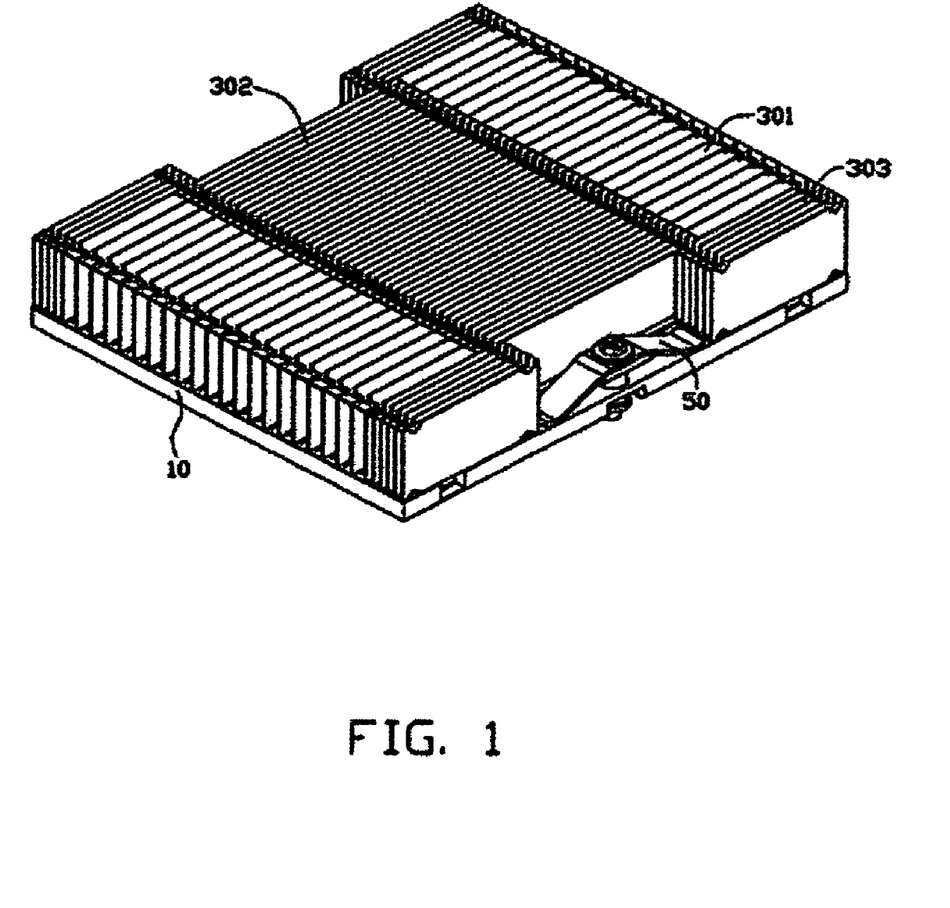
FIG. 1 is an isometric view of a heat sink in accordance with a preferred embodiment of the present invention.
Figure 2:
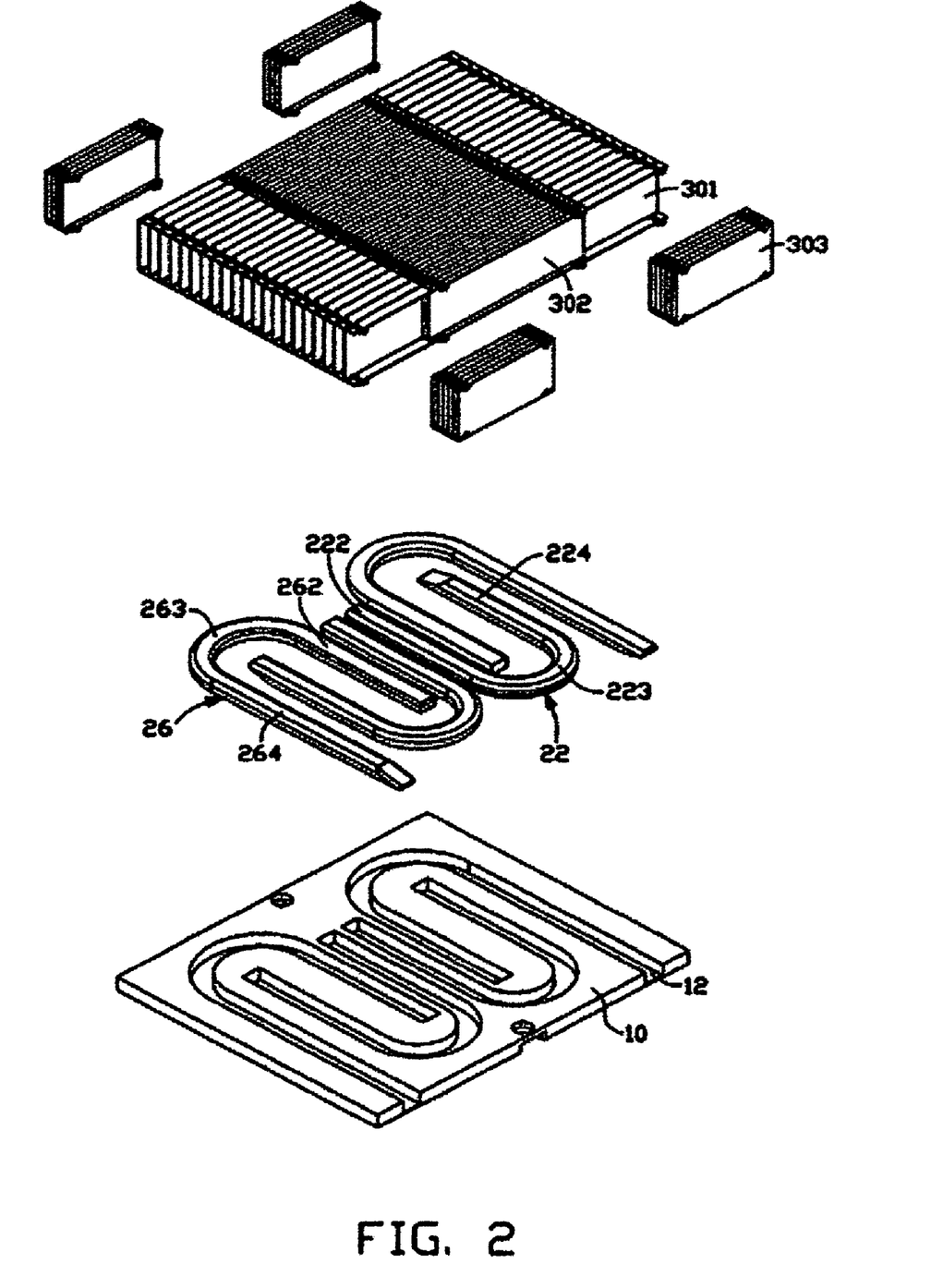
FIG. 2 is an exploded view of FIG. 1.

Referring FIGS. 1 and 2, a heat sink in accordance with a preferred embodiment of the present invention is used for dissipating heat from a heat-generating electronic component (not shown). The heat sink comprises a heat spreader 10 for contacting the electronic component to absorb heat therefrom, a plurality of parallel first fins 301 and second fins 302 provided on the heat spreader 10, and two pairs of U-shaped heat pipes 22, 26 soldered to the spreader 10 and disposed between the fins 301, 302 and the heat spreader 10.

The heat spreader 10 is a flat plate symmetrically defining two pairs of U-shaped grooves 12 in a top surface thereof, shown in FIG. 2. Each pair of grooves 12 extends opposite to each other in a stagger manner. The heat pipes 22, 26 each have continuously bended evaporation portions 222, 262, adiabatic portions 223, 263, and condensation portions 224, 264 parallel to the evaporation portions 222, 262. The heat pipes 22, 26 are tightly soldered into the grooves 12 of the heat spreader 10 and arranged crossways. In one pair of heat pipes, the evaporation portion 222 of one heat pipe 22 is between the evaporation portion 262 and condenser portion 264 of the other heat pipe 26, and the condenser portion 264 of the other heat pipe 26 is between the evaporation portion 222 and condenser portion 224 of the heat pipe 22. The two pairs of heat pipes 22, 26 are symmetrically arranged in the grooves 12 of the heat spreader 10.

Figure 3:
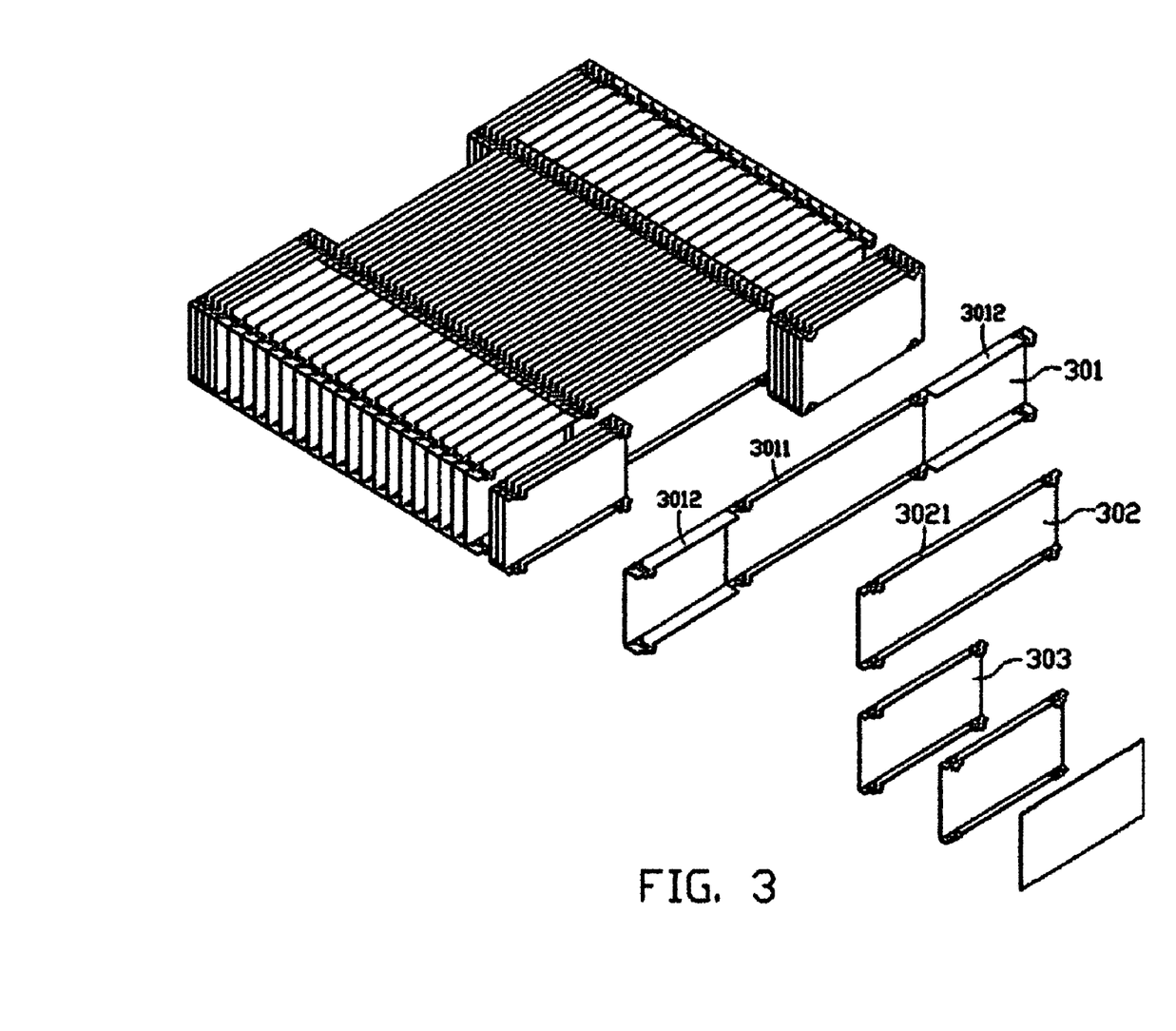
FIG. 3 is an exploded view of the fin combination of the heat sink in FIG. 1.

Referring to FIG. 3, the first fins 301 and second fins 302 are parallel to each other and stacked together, perpendicularly on a top face of the heat spreader 10, referring to FIG. 2 again. Each first fin 301 forms one pair of short clamping pieces 3011 and two pairs of long clamping pieces 3012, which are perpendicularly bent in the same direction from either of two opposite edges of the first fins 301 and extend in parallel to each other. The short clamping piece 3011 of one edge of the first fins 301 is between the two long clamping pieces 3012 thereof and integrally connected therewith. The second fins 302 are shorter than the first fins 301. Each second fin 302 forms two short clamping pieces 3021 respectively bent from two opposite edges of the second fins 302. The width of each long clamping piece 3012 equals the sum of the width of the short clamping piece 3011 of the first fin 301 and the short clamping piece 3021 of the second fins 302. Each of the short clamping pieces 3011 and 3021 forms a pair of tongues (not labeled) extending forward therefrom, while each of the long clamping pieces 3012 forms a tongue (not labeled) extending forward therefrom. Correspond to each tongue, a locking aperture (not labeled) is defined in the joint between each clamping piece and the corresponding first fin 301 and second fin 302.

Each of the first fins and second fins are constructed to have two opposite edges with clamping pieces and two opposite edges without clamping pieces.

The first fins 301 and the second fins 302 are arranged in alternating fashion on the heat spreader 10. The tongues of each long clamping piece 3011 of the first fins 301 extend into corresponding locking apertures of an adjacent first fins 301; the tongues of each short clamping piece 3010 of the first fin 301 extend into corresponding locking apertures of an adjacent second fin 302; the tongues of each second fin 302 extend in corresponding locking apertures of an adjacent first fin 301. Consequently, the first fin 301 and the second fin 302 are stacked together so as to form a fin combination in which each fin locks an adjacent fin by the engagement of the tongues and the locking apertures. The combination of the fins defines a plurality of parallel air passages extending parallel to the first fins 301 and second fins 302. The arrangement of the first fins 301 and second fins 302 is clearly shown in FIG. 4. The fin combination is adhered to the heat spreader 10 by soldering, with the clamping pieces 3011, 3012 and 3021 of one edge of the first fins 301 and second fins 302 contacting the heat spreader 10. In addition, four groups of third fins 303 are stacked on the heat spreader 10 at four corners thereof, parallel to and outside of the first fins 301 and the second fins 302. Two clips 50 are respectively located between two groups of the third fins 303.

Figure 4:
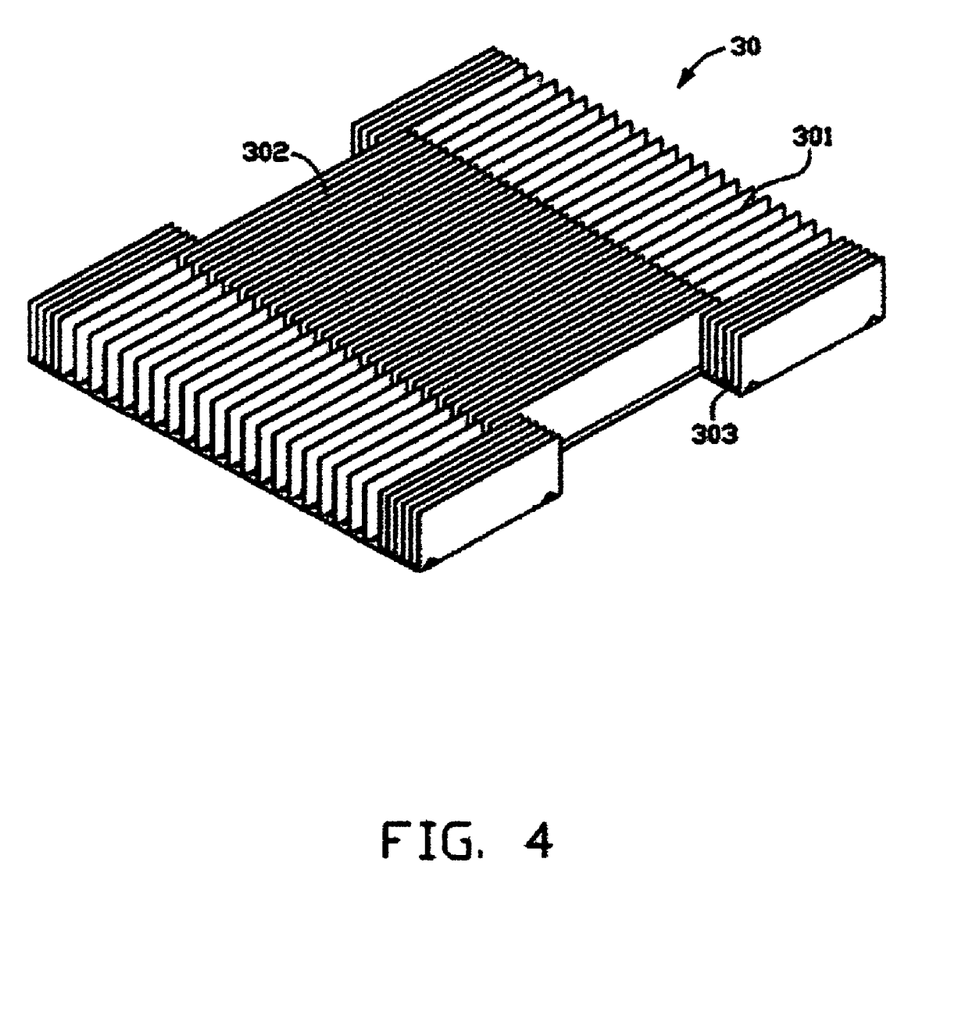
FIG. 4 is an assembled view of FIG. 3, with a top portion thereof being cut away for clearly showing an inner structure of the fin combination.

In said fin combination, the opposite edges without clamping pieces of the second fins 302 are between two opposite edges without clamping pieces of the first fins 301 along the extension direction of the air passages. The second fins 302 are preferably located in a middle of the extension of the first fins 301. FIG. 4 shows fin distribution in said fin combination with top portion thereof being cut out. The fin density at either end of the air passages is lower than that in the middle thereof, accordingly, the air passages at either end of the first fins 301 along the extension of the first fins 301 are sparse in comparison with that in the middle thereof, that is, the space between adjacent fins in the middle of the air passages is smaller than that at two ends thereof. Such a configuration results in an airflow which easily enters into the air passages due to the broader entrance of the air passages and makes a full heat exchange with the heat sink especially in the middle of the passages due to the dense fin distribution. Advantages from denseness and sparseness of fin distribution are compatibly obtained. The whole heat dissipation performance of the heat sink is enhanced.

Figure 5:
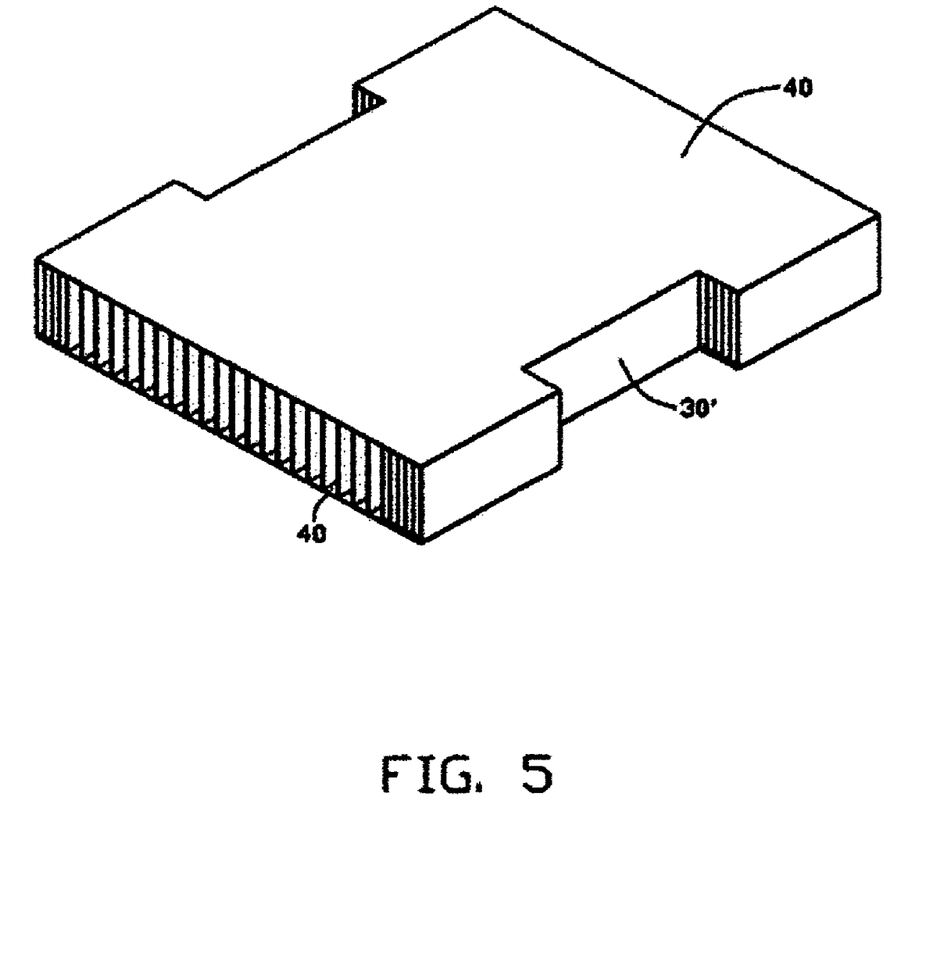
FIG. 5 is an isometric view of a variational practice of the fin combination in accordance with the first embodiment of the present invention.

In the heat sink, fins can also be stacked without mutual mechanical locking. For example, each fin 30' forms two folded edges (not shown) bearing an adjacent fin, and two separate and parallel plates 40 are soldered to the edges of the fins 30', which is illustrated in FIG. 5.

Figure 6:
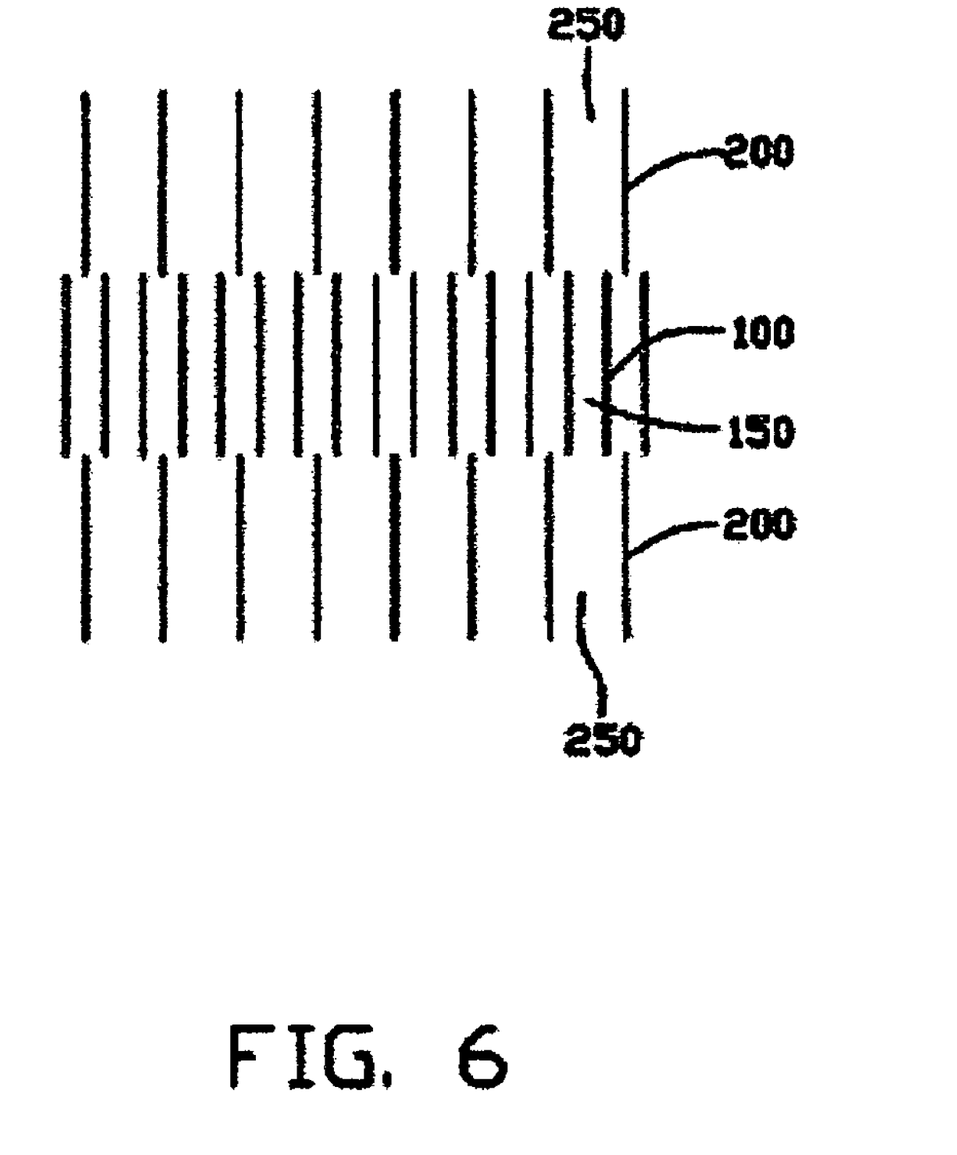
FIG. 6 is a schematic top view of a fin combination of another embodiment of the present invention.

FIG. 6 schematically illustrates a fin combination in accordance with another embodiment of the present invention. In this practice, the heat sink comprises a plurality of parallel first fins 100 defining a plurality of first air passages 150, and a plurality of second fins 200 parallel to the first fins 100 and arrayed at two opposite entrances of the first air passages 150 so as to define a plurality of second air passages 250 in communication with the first air passages 150. The first fins 100 are stacked together by said locking manner or others, and the second fins 200 too. In order to gain such a fin configuration similar to the first preferred embodiment, the space of adjacent first fins 100 is smaller than that of the second fins 200, accordingly, density of air passages 150 between the first fins 100 are higher than that between the second fins 200. This arrangement can also achieve the same airflow effect as the first preferred embodiment. In this embodiment, two first fins 100 are located between two second fins 200 along a direction perpendicular to the direction of the air passages 250, 150.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink comprising a plurality of parallel fins, stacked together and defining a plurality of parallel air passages, wherein fin density at two ends of the air passages is lower than the fin density in a middle thereof; wherein density of the air passages at the two ends is lower than the air passages in the middle thereof;

wherein the fins include first fins and second fins arranged in alternating fashion, and two opposite edges of the second fins are located between two opposite edges of the first fins along the extension of the air passages;

wherein each of the first and second fins forms at least a pair of clamping pieces for locking an adjacent fin; and wherein the fins are located on a base plate, and at least one heat pipe is completely accommodated between the base plate and the fins.

2. The heat sink as described in claim 1, wherein the fins includes a group of first parallel fins defining a plurality of first air passages, and two groups of second parallel fins which are parallel to the first parallel fins and define a plurality of second air passages extending from opposite ends of the first air passages and respectively in communication with the first air passages, the space between the first parallel fins being smaller than that between the second parallel fins.

3. The heat sink as described in claim 1, further comprising separate four groups of parallel third fins arrayed at two outsides of the first and second fins.

4. The heat sink as described in claim 2, further comprising two parallel plates sandwiching the first and second fins therebetween, and two opposite edges of the first and second fins parallel to an extension of the air passages contact the plates.

5. The heat sink as described in claim 1, wherein the second fins are located in a middle of the main extension direction of the first fins.

6. The heat sink as described in claim 1, wherein a tongue extends forward from the clamping piece.

7. The heat sink as described in claim 1, wherein the at least one heat pipe is bent in the form of U-shaped configuration and the base plate defines at least one U-shaped groove conformably receiving the at least one heat pipe therein.

8. A heat sink comprising:

a heat spreader into which at least a heat pipe is inserted; and a plurality of first fins and second fins parallelly arranged in alternating order on the heat spreader and defining a plurality of air passages, the first and second fins contacting with the at least a heat pipe;

wherein the first and second fins are arranged so that a dense air passages and fin distribution in a middle along an extension of the air passages and a sparse air passages and fin distribution at two ends are provided;

wherein the first fins and the second fins are stacked so as to form a fin combination in which adjacent fins are locked together; and wherein the heat spreader has a horizontal bottom face adapted for contacting with a heat-generating electronic component and a horizontal top face, the first and second fins are mounted on the top face of the heat spreader and the at least a heat pipe is horizontally inserted into the top face of the heat spreader and sandwiched between the heat spreader and the first and second fins.

9. The heat sink as described in claim 8, wherein the first fins and the second fins are alternated along a direction perpendicular to the extension of the air passages.

10. The heat sink as described in claim 8, wherein the space between adjacent first fins is smaller than that between adjacent second fins.

11. The heat sink as described in claim 10, wherein the first fins define a plurality of first air passages, and the second fins define a plurality of second air passages out of the first air passages and in communication with the first air passages.

12. The heat sink as described in claim 8, wherein the first fins and the second fins are parallel to each other and alternated in a direction perpendicular to the first fins.

13. The heat sink as described in claim 12, wherein the second fins are shorter than the first fins.

14. The heat sink as described in claim 12, wherein each of the first fins and the second fins forms at least two clamping pieces with tongues for locking an adjacent fin.

15. A beat sink comprising:
- a heat spreader having a bottom face adapted for contacting with a heat-generating electronic component and a top face in which at least a U-shaped groove is defined, said at least a U-shaped groove conformably receiving at least a U-shaped heat pipe therein; and
- a plurality of first fins mounted on the top face and contacting with the heat pipe; and
- a plurality of second fins mounted on the top face, contacting with the heat pipe and inserted between the first fins to cooperate with the first fins to form a fin combination, wherein the fin combination has a dense fin distribution at a middle thereof, and a sparse fin distribution at opposite ends thereof.

* * * * *